(12) United States Patent
Chiu et al.

(10) Patent No.: US 10,242,965 B2
(45) Date of Patent: Mar. 26, 2019

(54) SEMICONDUCTOR DEVICE INCLUDING INTERCONNECTED PACKAGE ON PACKAGE

(71) Applicant: SANDISK INFORMATION TECHNOLOGY (SHANGHAI) CO., LTD., Shanghai (CN)

(72) Inventors: Chin-Tien Chiu, Taichung (TW); Hem Takiar, Fremont, CA (US)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 15/619,812

(22) Filed: Jun. 12, 2017

(65) Prior Publication Data

US 2018/0005974 A1    Jan. 4, 2018

(30) Foreign Application Priority Data

Jul. 4, 2016    (CN) .......................... 2016 1 0532093

(51) Int. Cl.
*H01L 25/00*    (2006.01)
*H01L 23/00*    (2006.01)
(Continued)

(52) U.S. Cl.
CPC ............. *H01L 24/49* (2013.01); *H01L 24/17* (2013.01); *H01L 25/0657* (2013.01); *H01L 25/105* (2013.01); *H01L 25/50* (2013.01); *H01L 25/04* (2013.01); *H01L 25/043* (2013.01); *H01L 25/074* (2013.01); *H01L 25/0756* (2013.01); *H01L 25/112* (2013.01); *H01L 25/117* (2013.01); *H01L 2224/05554* (2013.01); *H01L 2224/49105* (2013.01); *H01L 2224/49175* (2013.01); *H01L 2225/0651* (2013.01); *H01L 2225/06506* (2013.01); *H01L 2225/06517* (2013.01); *H01L 2225/06562* (2013.01);
(Continued)

(58) Field of Classification Search
CPC .................... H01L 24/49; H01L 24/17; H01L 25/04–25/0756
See application file for complete search history.

(56) References Cited

U.S. PATENT DOCUMENTS 6,150,724 A    11/2000    Wenzel et al.
8,125,092 B2 *   2/2012    Corisis ................ H01L 23/3128
                                                              257/784
(Continued)

FOREIGN PATENT DOCUMENTS

CN    101399256    4/2009
CN    101866915    10/2010
(Continued)

OTHER PUBLICATIONS

U.S. Appl. No. 15/619,812, filed Jun. 12, 2017.
(Continued)

*Primary Examiner* — Ida M Soward
(74) *Attorney, Agent, or Firm* — Vierra Magen Marcus LLP

(57) ABSTRACT

A semiconductor device is disclosed including at least first and second vertically stacked and interconnected semiconductor packages. Signal communication between the second semiconductor package and a host device occurs through the first semiconductor package.

10 Claims, 9 Drawing Sheets

(51) Int. Cl.
  *H01L 25/065* (2006.01)
  *H01L 25/10* (2006.01)
  *H01L 25/11* (2006.01)
  *H01L 25/075* (2006.01)
  *H01L 25/04* (2014.01)
  *H01L 25/07* (2006.01)

(52) U.S. Cl.
  CPC ......... *H01L 2225/06572* (2013.01); *H01L 2225/06575* (2013.01); *H01L 2225/1023* (2013.01); *H01L 2225/1041* (2013.01); *H01L 2225/1058* (2013.01); *H01L 2924/00014* (2013.01); *H01L 2924/1438* (2013.01); *H01L 2924/181* (2013.01); *H01L 2924/37001* (2013.01)

(56) References Cited

U.S. PATENT DOCUMENTS

| | | | |
|---|---|---|---|
| 8,232,631 B2* | 7/2012 | Cho | H01L 21/6835 257/686 |
| 8,253,232 B2 | 8/2012 | Kim et al. | |
| 8,436,455 B2* | 5/2013 | Eun | H01L 23/481 257/686 |
| 8,525,349 B2* | 9/2013 | Song | H01L 22/32 257/686 |
| 9,184,128 B2* | 11/2015 | Hung | H01L 23/5226 |
| 9,230,942 B2* | 1/2016 | Kumar | H01L 25/0657 |
| 9,240,393 B2* | 1/2016 | Yu | H01L 23/3135 |
| 2007/0001277 A1 | 1/2007 | Ichikawa | |
| 2007/0141750 A1 | 6/2007 | Iwasaki et al. | |
| 2007/0235850 A1 | 10/2007 | Gerber et al. | |
| 2008/0105984 A1* | 5/2008 | Lee | H01L 23/3128 257/777 |
| 2008/0197472 A1 | 8/2008 | Matsushiima | |
| 2009/0166846 A1 | 7/2009 | Pratt et al. | |
| 2009/0309206 A1* | 12/2009 | Kim | H01L 24/91 257/686 |
| 2010/0072593 A1* | 3/2010 | Kim | H01L 21/563 257/676 |
| 2010/0171206 A1 | 7/2010 | Chu et al. | |
| 2010/0181661 A1* | 7/2010 | Takemoto | H01L 24/24 257/686 |
| 2010/0193930 A1 | 8/2010 | Lee | |
| 2010/0265751 A1 | 10/2010 | Hong | |
| 2010/0283140 A1* | 11/2010 | Kim | H01L 23/3128 257/686 |
| 2011/0127679 A1 | 6/2011 | Eun | |
| 2011/0133324 A1 | 6/2011 | Fan et al. | |
| 2011/0244634 A1* | 10/2011 | Kim | H01L 24/91 438/124 |
| 2012/0025398 A1 | 2/2012 | Jang et al. | |
| 2012/0091597 A1 | 4/2012 | Kwon et al. | |
| 2012/0217642 A1 | 8/2012 | Sun et al. | |
| 2013/0062784 A1* | 3/2013 | Hong | G11C 5/06 257/777 |
| 2014/0264858 A1 | 9/2014 | Chen et al. | |
| 2016/0093590 A1* | 3/2016 | Chen | H01L 25/0657 257/737 |
| 2016/0111409 A1 | 4/2016 | Yew et al. | |
| 2016/0141227 A1 | 5/2016 | Lin et al. | |
| 2016/0334845 A1 | 11/2016 | Mittal et al. | |
| 2016/0343649 A1 | 11/2016 | Chen | |
| 2017/0033084 A1 | 2/2017 | Chang et al. | |
| 2017/0278821 A1 | 9/2017 | Zhao et al. | |
| 2017/0294410 A1* | 10/2017 | Haba | H01L 25/0657 |
| 2017/0373039 A1 | 12/2017 | Hsu et al. | |

FOREIGN PATENT DOCUMENTS

| | | |
|---|---|---|
| CN | 102629604 | 8/2012 |
| KR | 20100114421 A | 10/2010 |

OTHER PUBLICATIONS

Response to Office Action filed Apr. 17, 2018 in U.S. Appl. No. 15/620,471.
Office Action dated May 23, 2018 in U.S. Appl. No. 15/620,471.
Office Action dated Apr. 12, 2018, and English Summary Translation, in Korean Patent Application No. 10-2017-0079029.
English language Abstract for KR20100114421 published Oct. 25, 2010.
Response to Office Action filed Aug. 22, 2018 in U.S. Appl. No. 15/620,471.
Office Action dated Aug. 3, 2018 in Chinese Patent Application No. 201610532093.1.
English language abstract for CN101866915 published Oct. 20, 2010.
English language abstract for CN101399256 published Apr. 1, 2009.
English language abstract for CN102629604 published Aug. 8, 2012.
Office Action dated Jan. 17, 2018 in U.S. Appl. No. 15/619,812.
Response to Office Action filed Jul. 12, 2018 in Korean Patent Application No. 10-2017-0079029, 42 pages.
Response to Office Action filed Dec. 20, 2018 in Korean Patent Application No. 10-2017-0079029.
Office Action dated Oct. 23, 2018 in Korean Patent Application No. 10-2017-0079029, 7 pages.

* cited by examiner

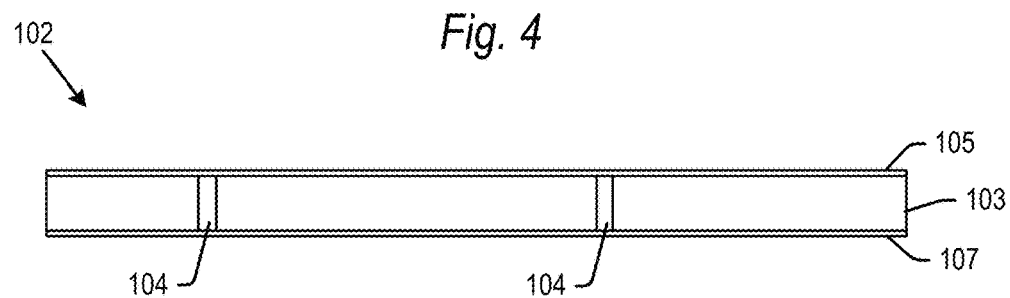
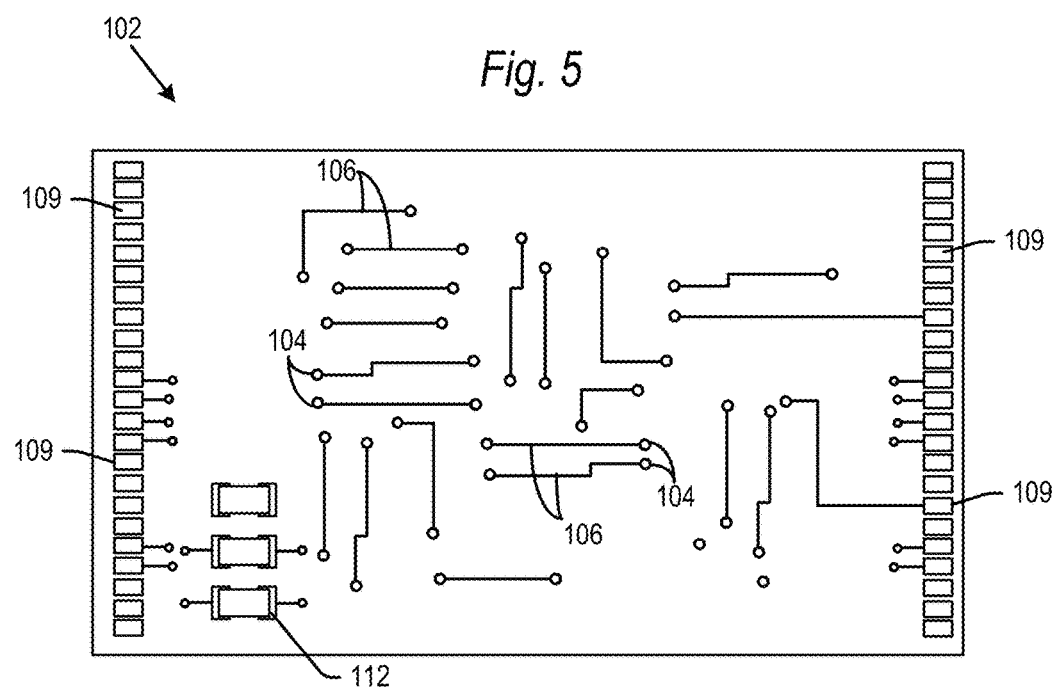
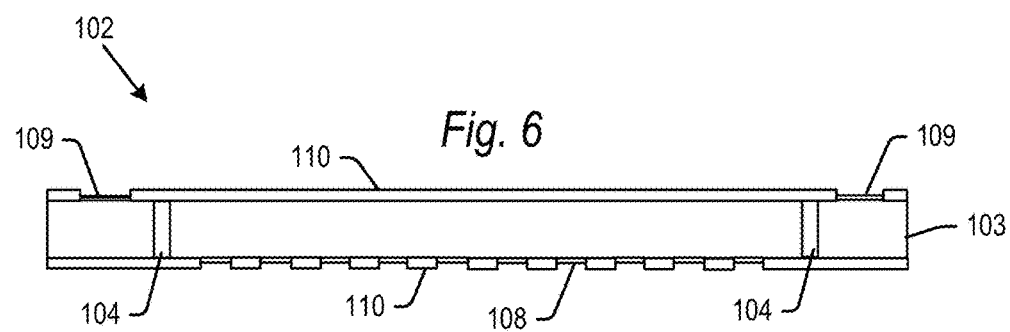

SEMICONDUCTOR DEVICE INCLUDING INTERCONNECTED PACKAGE ON PACKAGE

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

A cross-sectional side view and a top view of a conventional semiconductor package 20 are shown in FIGS. 1 and 2 (without molding compound in FIG. 2). Typical packages include a plurality of semiconductor die, such as flash memory die 22 and controller die 24, affixed to a substrate 26. A plurality of die bond pads 28 may be formed on the semiconductor die 22, 24 during the die fabrication process. Similarly, a plurality of contact pads 30 may be formed on the substrate 26. Die 22 may be affixed to the substrate 26, and then die 24 may be mounted on die 22. All die may then be electrically coupled to the substrate by affixing wire bonds 32 between respective die bond pad 28 and contact pad 30 pairs. Once all electrical connections are made, the die and wire bonds may be encapsulated in a molding compound 34 to seal the package and protect the die and wire bonds.

In order to most efficiently use package footprint, it is known to stack semiconductor die on top of each other, either completely overlapping each other with a spacer layer in between adjacent die, or with an offset as shown in FIGS. 1 and 2. In an offset configuration, a die is stacked on top of another die so that the bond pads of the lower die are left exposed. An offset configuration provides an advantage of convenient access of the bond pads on each of the semiconductor die in the stack.

As semiconductor die become thinner, and in order to increase memory capacity in semiconductor packages, the number of die stacked within a semiconductor package continues to increase. However, this can make for long bonds wire from the upper die down to the substrate. Long bonds wire are easily damaged or shorted to other wire bonds, and also have higher signal to noise ratio than shorter bond wires. Also, larger numbers of semiconductor die in a package can adversely affect yields.

DESCRIPTION OF THE DRAWINGS

FIG. 4 is a side view of a semiconductor device at a first step in the fabrication process according to an embodiment of the present technology.

FIG. 5 is a top view of a semiconductor device at a second step in the fabrication process according to an embodiment of the present technology.

FIG. 6 is a side view of a semiconductor device at a third step in the fabrication process according to an embodiment of the present technology.

DETAILED DESCRIPTION

Figure 1:
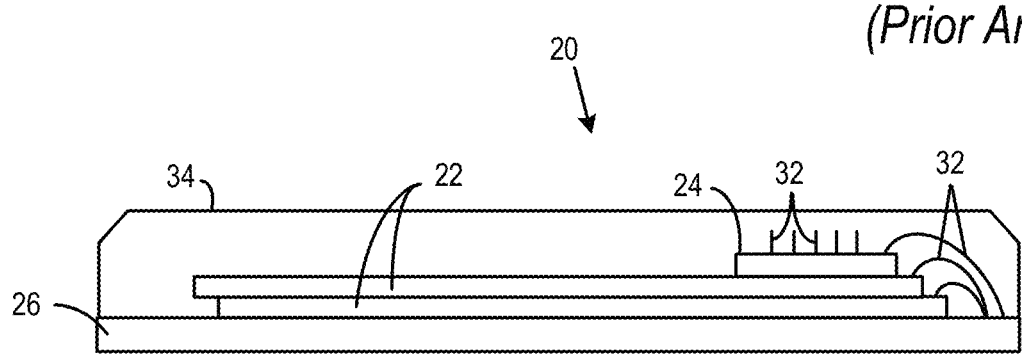
FIG. 1 is a cross-sectional side view of a conventional semiconductor package.
Figure 2:
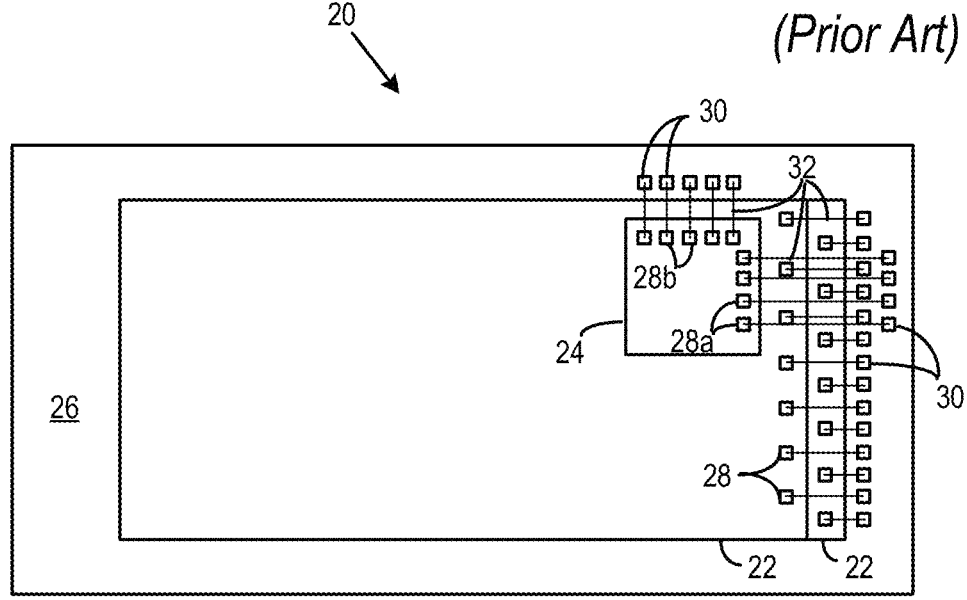
FIG. 2 is a top view of a conventional substrate and wire bonded semiconductor die.

The present technology will now be described with reference to the figures, which in embodiments, relate to a semiconductor device including vertically stacked and interconnected semiconductor packages. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal" as may be used herein are by way of example and illustrative purposes only, and are not meant to limit the description of the invention inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±0.25%.

An embodiment of the present invention will now be explained with reference to the flowchart of FIG. 3 and the top and side views of FIGS. 4 through 18. Although FIGS. 4 through 18 each show an individual semiconductor package 100 and/or 150, or a portion thereof, it is understood that the packages 100 and 150 may be batch processed along with a plurality of other packages on substrate panels to achieve economies of scale. The number of rows and columns of packages 100, 150 on the substrate panels may vary.

The substrate panel for the fabrication of semiconductor package 100 begins with a plurality of substrates 102 (again, one such substrate is shown in FIGS. 4 through 12). The substrate 102 may be a variety of different chip carrier mediums, including a printed circuit board (PCB), a leadframe or a tape automated bonded (TAB) tape. Where substrate 102 is a PCB, the substrate may be formed of a core 103 having a top conductive layer 105 and a bottom conductive layer 107 as indicated in FIG. 4. The core 103 may be formed of various dielectric materials such as for example, polyimide laminates, epoxy resins including FR4 and FR5, bismaleimide triazine (BT), and the like. Although not critical to the present invention, the core may have a thickness of between 40 microns (μm) to 200 μm, although the thickness of the core may vary outside of that range in alternative embodiments. The core 103 may be ceramic or organic in alternative embodiments.

The conductive layers 105, 107 surrounding the core may be formed of copper or copper alloys, plated copper or plated copper alloys, Alloy 42 (42Fe/58Ni), copper plated steel, or other metals and materials known for use on substrate panels. The conductive layers may have a thickness of about 10 μm to 25 μm, although the thickness of the layers may vary outside of that range in alternative embodiments.

Figure 3:
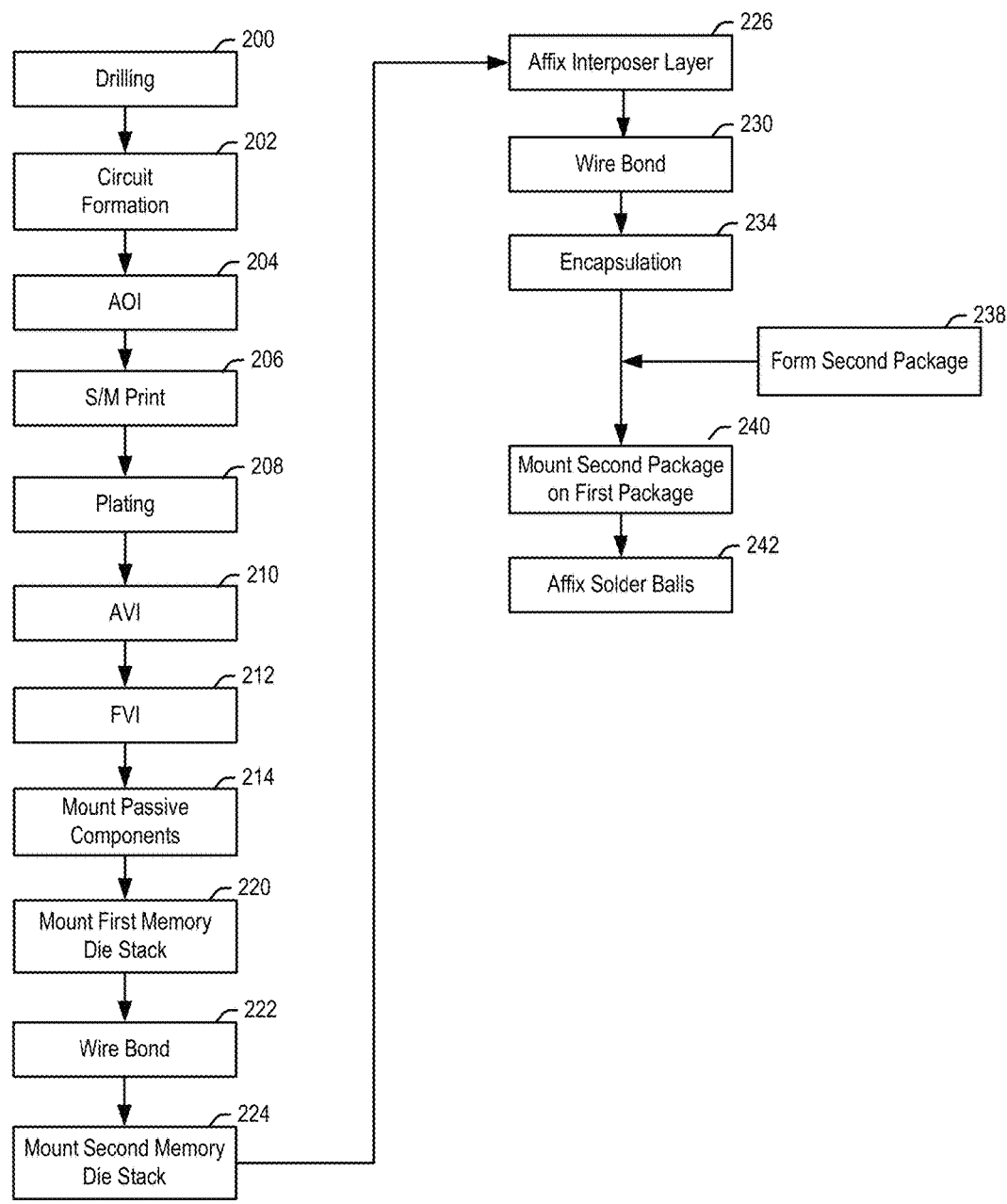
FIG. 3 is a flowchart of the overall fabrication process of semiconductor device according to embodiments of the present invention.

FIG. 3 is a flowchart of the fabrication process for forming a semiconductor device 180 according to embodiments of the present invention. In a step 200, the substrate 102 of a first semiconductor package 100 may be drilled to define through-hole vias 104 in the substrate 102. The vias 104 are by way of example, and the substrate 102 may include many more vias 104 than are shown in the figures, and they may be in different locations than are shown in the figures. Conductance patterns are next formed on one or both of the top and bottom conductive layers in step 202. The conductance pattern(s) may include electrical traces 106, contact pads 109 on a top surface of the substrate and contact pads 108 on a bottom surface of the substrate as shown for example in FIGS. 5 and 6. The traces 106 and contact pads 109, 108 (only some of which are numbered in the figures) are by way of example, and the substrate 102 may include more traces and/or contact pads than is shown in the figures, and they may be in different locations than is shown in the figures. In one embodiment, the substrate 102 may include one or more rows of contact pads 109 at opposed edges of the substrate 102 as shown in FIG. 5.

In embodiments, the finished semiconductor device may be used as a BGA (ball grid array) package. A lower surface of the substrate 102 may include contact pads 108 for receiving solder balls as explained below. In further embodiments, the finished semiconductor device 180 may be an LGA (land grid array) package including contact fingers for removably coupling the finished device 180 within a host device. In such embodiments, the lower surface may include contact fingers instead of the contact pads that receive solder balls. The conductance pattern on the top and/or bottom surfaces of the substrate 102 may be formed by a variety of known processes, including for example various photolithographic processes.

Referring again to FIG. 3, the substrate 102 may next be inspected in an automatic optical inspection (AOI) in step 204. Once inspected, a solder mask 110 may be applied to the substrate in step 206. After the solder mask is applied, the contact pads, and any other areas to be soldered on the conductance patterns may be plated with a Ni/Au, Alloy 42 or the like in step 208 in a known electroplating or thin film deposition process. The substrate 102 may then be inspected and tested in an automated inspection process (step 210) and in a final visual inspection (step 212) to check electrical operation, and for contamination, scratches and discoloration.

Assuming the substrate 102 passes inspection, passive components 112 (FIG. 5) may next be affixed to the substrate in a step 214. The one or more passive components may include for example one or more capacitors, resistors and/or inductors, though other components are contemplated. The passive components 112 shown are by way of example only, and the number, type and position may vary in further embodiments.

Figure 7:
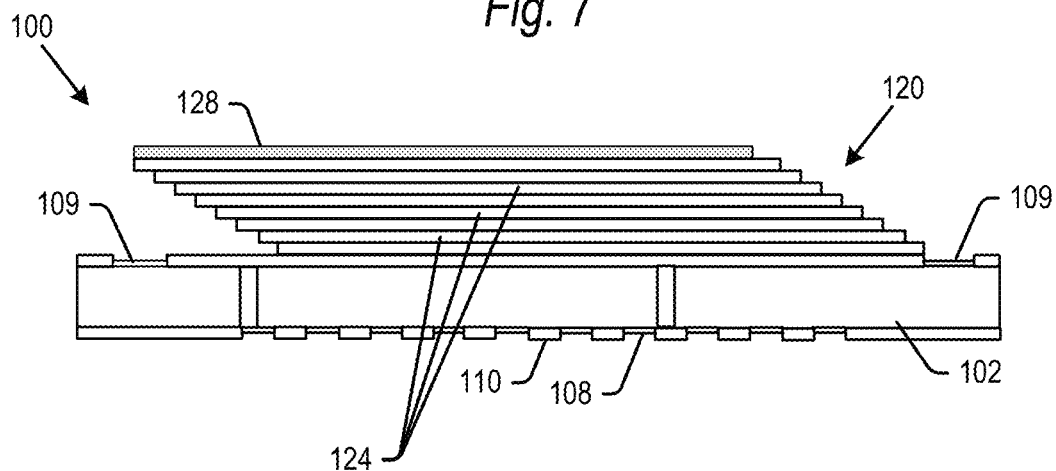
FIG. 7 is a side view of a semiconductor device at a fourth step in the fabrication process according to an embodiment of the present technology.

Referring to FIG. 7, a number of semiconductor die 124 may next be stacked on the substrate 102 in step 220. The semiconductor die 124 may for example be memory die such a NAND flash memory die, but other types of die 124 may be used. The semiconductor die 124 may be stacked atop each other in an offset stepped configuration to form a die stack 120. The die may be affixed to the substrate and/or each other using a die attach film. As one example, the die attach film may be 8988UV epoxy from Henkel AG & Co. KGaA, cured to a B-stage to preliminarily affix the die 124 in the stack 120, and subsequently cured to a final C-stage to permanently affix the die 124 in the stack 120.

Figure 8:
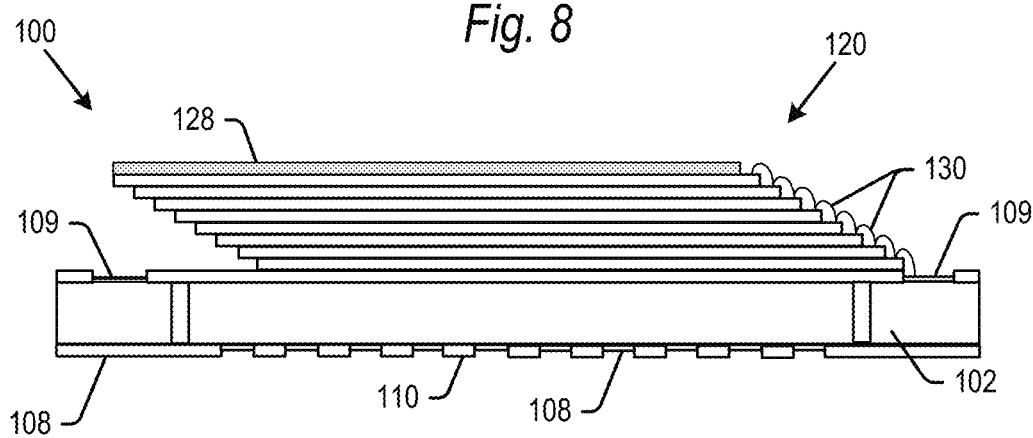
FIG. 8 is a side view of a semiconductor device at a fifth step in the fabrication process according to an embodiment of the present technology.
Figure 9:
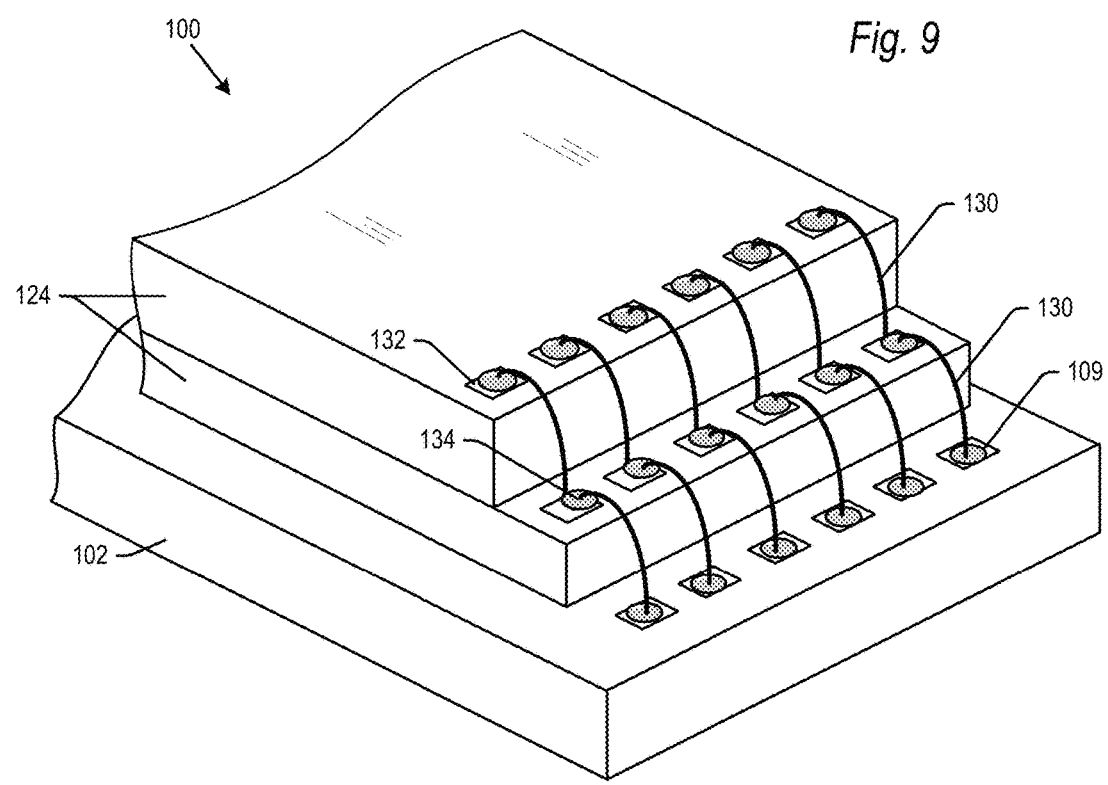
FIG. 9 is a simplified perspective view of a semiconductor device at the fifth step in the fabrication process according to an embodiment of the present technology.

Referring now to side view of FIG. 8, once the die stack 120 is formed, the respective die 124 in the stack 120 may be electrically connected to each other and the substrate 102 in step 222 using wire bonds 130. FIG. 9 is a simplified perspective view showing the substrate 102 and only the bottom two die 124 in die stack 120. As shown, each semiconductor die 124 may include a row of die bond pads 132 along an edge of the die 124. It is understood that each die 124 may include many more die bond pads 132 than is shown in FIG. 9. Each die bond pad 132 in the row of a semiconductor die may be electrically connected to the corresponding die bond pad 132 in the row of the next adjacent semiconductor die using a wire bond 130. Each die bond pad 132 of the bottom semiconductor die 124 may be electrically connected to the corresponding contact pad 109 in a row of contact pads on substrate 102 using a wire bond 130.

Although wire bonds 130 may be formed by a variety of technologies, in one embodiment, the wire bonds 130 may be formed as ball bonds and/or wedge bonds. The wire bonds 130 are shown generally in a straight vertical column from one layer to the next in the die stack 120 and substrate, one or more of the wire bonds may extend diagonally from one layer to the next. Further, it may be that a wire bond skips one or more layers in the die stack 120.

As explained in the following paragraphs, a second die stack may be stacked on top the first die stack 120. In order to provide room for the wire bond to the uppermost die 124 in the first die stack 120, a spacer layer 128 (FIGS. 7 and 8) may be provided on an upper surface of the uppermost die 124 in stack 120. Spacer layer 128 may also be an adhesive film for adhering the second die stack on top of the first die stack 120.

The spacer layer 128 may for example be an electrically insulative adhesive epoxy of known composition available for example from Nitto Denko Corp. of Japan or Henkel Corporation, California. In an alternative embodiment, spacer balls may be provided instead of or within the spacer layer 128. The spacer balls may be polymeric spheres that act as spacers between the first and second die stacks. Such spacer balls are known in the art, and are disclosed for example in U.S. Pat. No. 6,650,019, entitled, "Method of Making a Semiconductor Package Including Stacked Semiconductor Die." The spacer layer 128 may have a thickness sufficient to prevent the second die stack from contacting the wire bonds 130 to the uppermost die.

Figure 10:
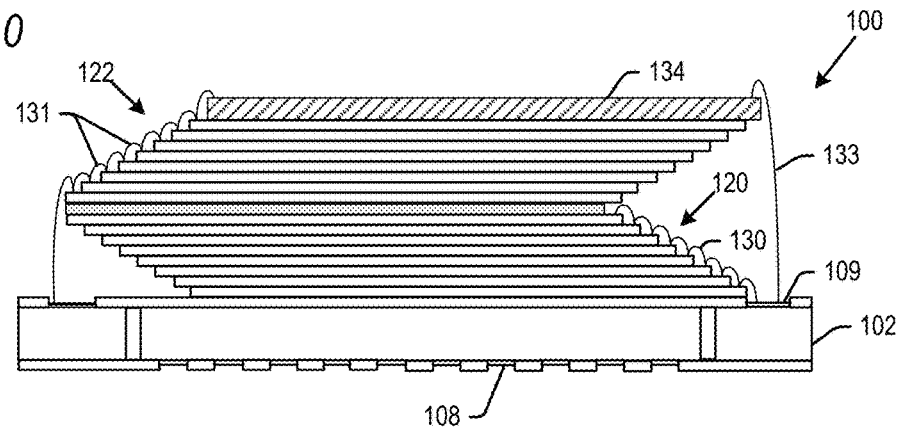
FIG. 10 is a side view of a semiconductor device at a sixth step in the fabrication process according to an embodiment of the present technology.
Figure 11:
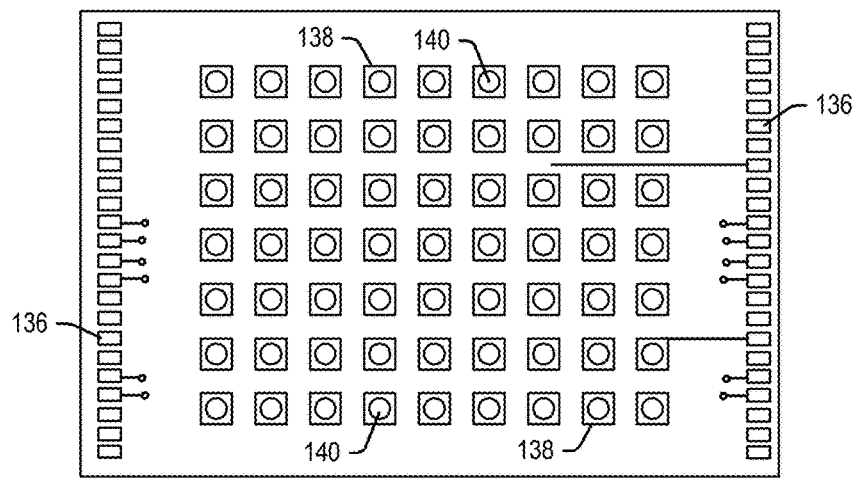
FIG. 11 is a top view of an interposer layer used in the semiconductor device according to an embodiment of the present technology.

Referring now to the side view of FIG. 10, a second die stack 122 may next be affixed on top of the first die stack 120 in step 224. In embodiments, the second die stack 122 may be formed in a manner similar to die stack 120 but stepped in the opposite direction as die stack 120 to minimize the footprint of the die stacks 120 and 122 together. The die stacks 120 and 122 may each comprise eight semiconductor die 124 for a total of sixteen semiconductor die. However, it is understood that the total number of die may be less than or greater than sixteen in further embodiments. Such further embodiments may for example include eight or thirty-two total semiconductor die in the package 100.

After the die stacks 120, 122 are formed, an interposer layer 134 may be affixed to the upper die 124 in the upper stack 122 in step 226 and as shown in FIG. 10. The interposer layer 134 may be offset in the same way and to the same extent as the other die 124 in stack 122. Interposer layer 134 may be a rigid layer, formed for example of FR4 and FR5, or a flexible layer, formed for example of polyimide tape. As shown in part in the top view of FIG. 11, a conductance pattern may be formed on an upper surface and within the interposer layer 134.

The conductance pattern of the interposer layer 134 may include two rows of bond pads 136, a pattern of contact pads 138 and electrical traces which electrically connect the two rows of bond pads 136 with corresponding ones of contact pads 138. Solder balls 140 may be formed on the contact pads 138, either before or after mounting of the interposer layer 134 on the die stack 122. As explained below, a second semiconductor package 150 may be mounted and electrically connected to the first semiconductor package 100 via the solder balls 140 of the interposer layer 134.

After mounting, the die stack 122 and interposer layer 134 may next be wire bonded to each other and the substrate 102 in a step 230. As shown in FIG. 10, wire bonds 131 may be formed on the bond pads 136 along one edge of the interposer layer 134, down to the die bond pads on each die 124 in the second die stack 122, and then down to contact pads 109 on a top surface of the substrate 102, as shown along the left edge of the package 100. In an alternative embodiment, the spacer layer 128 may be replaced by a second interposer layer (not shown) between the first and second die stacks 120, 122. In such an embodiment, instead of making the jump from the bottom die 124 in the stack 122 to the substrate as shown in FIG. 10, the interposer layer between the stacks 120, 122 may couple the wire bonds 131 in stack 122 to the wire bonds 130 in the stack 120 on the opposite side of package 100.

In addition to wire bonds 131 connected to the bond pads 136 on the first edge of the interposer layer, a second set of wire bonds 133 may be connected to the bond pads 136 along the second edge of the interposer layer. These wire bonds 133 may bypass the die in stacks 120 and 122 and be connected directly to contact pads 109 on the substrate 102, as shown on the right edge of the package 100 in FIG. 10. As explained below, the wire bonds 133 may transfer voltages from the second semiconductor package 150 directly to the substrate 102 via the interposer layer 134. Such voltages may for example be non I/O voltages, such as power/ground, clock signals or chip enable signals. It is understood that the sides of package 100 including wire bonds 131 and 133 may be switched in further embodiments.

While two separate stacks 120, 122 are shown in the figures, it is understood that the semiconductor die in package 100 may be stacked in a variety of other formations. The die may all be stepped in the same direction. Alternatively, there may be more than two die stacks, each mounted on top of the preceding and stepped in opposite directions. Each such stack may include for example two, four or eight semiconductor die. Regardless of the number of die stacks, an interposer layer 134 may be affixed to the uppermost die in the uppermost die stack to connect the first package 100 with the second package 150 as explained below.

Figure 12:
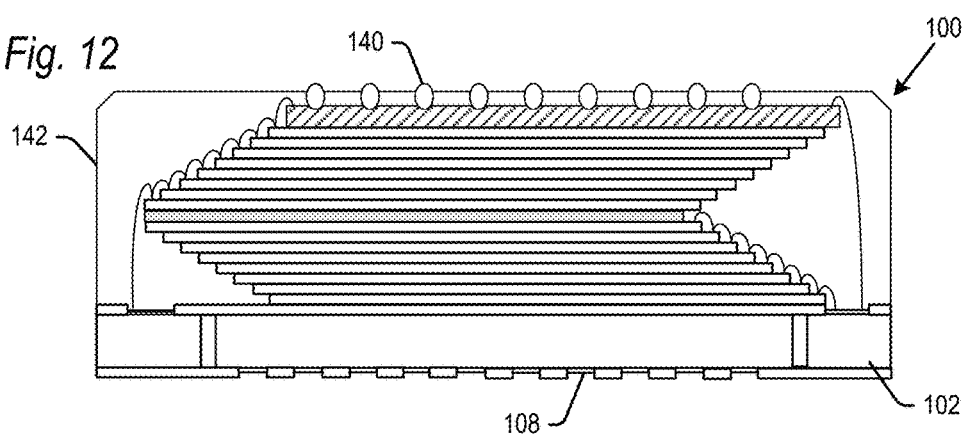
FIG. 12 is a side view of a first completed semiconductor according to an embodiment of the present technology.

Following mounting and electrical connection of the die stacks 120, 122 and interposer layer 134, the die stacks, wire bonds, interposer layer and at least a portion of the substrate may be encapsulated in a mold compound 142 in a step 234 and as shown in FIG. 12. Mold compound 142 may include for example solid epoxy resin, Phenol resin, fused silica, crystalline silica, carbon black and/or metal hydroxide. Such mold compounds are available for example from Sumitomo Corp. and Nitto-Denko Corp., both having headquarters in Japan. Other mold compounds from other manufacturers are contemplated. The mold compound may be applied according to various known processes, including by transfer molding or injection molding techniques. As shown in FIG. 12, the molding compound may be applied so that at least portions of the solder balls 140 on the interposer layer 134 are exposed above a surface of the mold compound 142.

Figure 13:
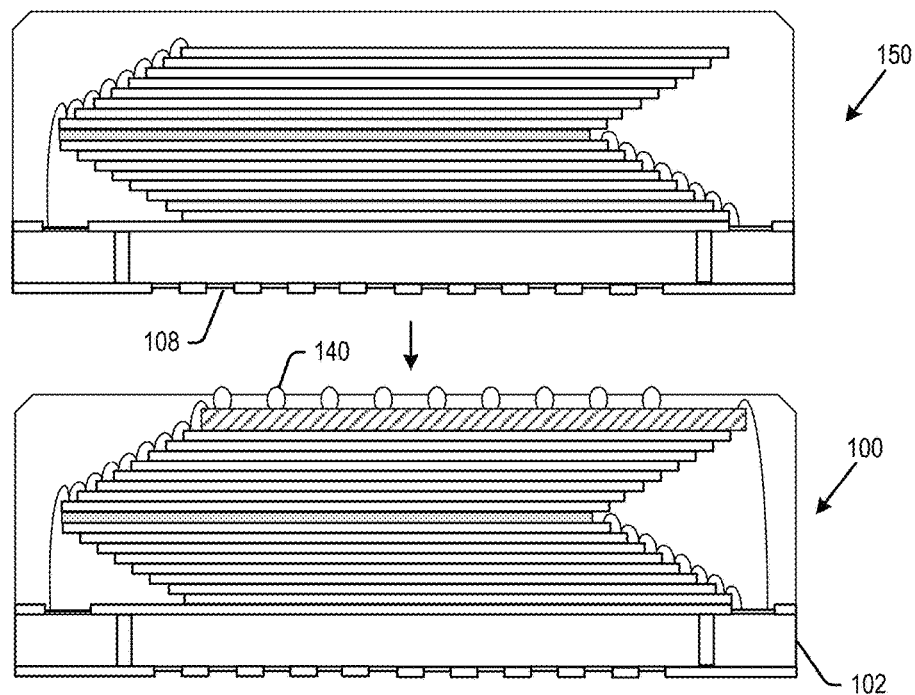
FIG. 13 shows first and second semiconductor packages to be affixed to each in a further step in the fabrication process according to an embodiment of the present technology.

Before, during or after the formation of encapsulated semiconductor package 100, a second semiconductor package 150 may be formed in step 238. In embodiments, the package 150 may be a flash memory package formed by the same steps as the package 100, such as for example the above-described steps 200-234 of FIG. 3. However, in further embodiments, the interposer layer 134, and wire bonds connected to the interposer layer 134, in package 100 may be omitted from package 150 as shown in FIG. 13. It is understood that package 150 may have other differences relative to package 100 in further embodiments, including for example the number of die, the number of die stacks and the orientation of the die stacks.

In step 240, the second semiconductor package 150 may be mounted to the first semiconductor package 100. In particular, the second semiconductor package 150 may be formed with contact pads 108 on a bottom surface of the substrate 102 that match the pattern of solder balls 140 extending above the encapsulated surface of the package 100. The package 150 may be aligned over the package 100 (FIG. 13), and then lowered on top of the package 100 (FIG.

14). Thereafter, the solder balls 140 in package 100 may be reflowed onto the contact pads 108 on the lower surface of the package 150 to physically and electrically couple the packages 100 and 150 together to form a completed semiconductor device 180.

Solder balls 184 may be affixed to the contact pads 108 on a lower surface of substrate 102 of the package 100 in step 242 to affix the semiconductor device 180 to a host device (not shown) such as a printed circuit board. The solder balls 184 may be affixed to the package 100 before or after the packages 100 and 150 are affixed to each other. In embodiments, the package 150 may be affixed to the package 100 during the same reflow process in which the package 100 is affixed to the host device.

In embodiments, once affixed to each other, both packages 100 and 150 of device 180 may be encapsulated together in a further encapsulation process. Alternatively, any space between the packages 100 and 150 may be back-filled with an epoxy resin. In further embodiments, no further encapsulation or back-fill steps are performed, and the packages 100 and 150 are held together simply by the solder balls 140.

As noted, in embodiments, the package 150 may be identical to package 100, including an interposer layer 134 with solder balls extending through an upper surface of the package 150. In such embodiments, a third semiconductor package (not shown) may be mounted on top of the package 150 to provide three semiconductor packages in the device 180. It is understood that more than three such packages may be stacked in this manner in further embodiments.

A controller die (not shown) may further be provided within the semiconductor device 180, mounted within package 100, mounted in the package 150, or mounted in both packages 100, 150. In one embodiment, the controller may be mounted within a cavity formed below the die stack 120 in package 100. For example, the controller die may be mounted within a spacer layer provided between the substrate 102 and bottom die stack 120. An example of such an embodiment is disclosed in Patent Cooperation Treaty Patent Application No. PCT/CN2013/070264, entitled "Semiconductor Device Including an Independent Film Layer For Embedding and/or Spacing Semiconductor Die," with an international filing date of Jan. 9, 2013. As a further example, the controller die may be mounted within a cavity in the substrate 102. An example of such an embodiment is disclosed in Patent Cooperation Treaty Patent Application No. PCT/CN2013/071051, entitled "Semiconductor Device Including an Embedded Controller Die and Method of Making Same," with an international filing date of Jan. 28, 2013.

Read/write operations to/from a semiconductor die enabled in the top semiconductor package 150 may flow between the package 150 and the host device via the package 100. For example, a signal may be communicated between the host device and an enabled semiconductor die 124a in package 150 (FIG. 14) by travelling through the package 100 via the substrate 102, wire bonds 131 and interposer layer 134 to the solder balls 140. From there, the signal may travel through the substrate 102 in package 150 and to the die 124a via wire bonds 130. A signal may be communicated between the host device and an enabled semiconductor die 124b in package 150 by travelling through the package 100 via the substrate 102, wire bonds 131 and interposer layer 134 to the solder balls 140. From there, the signal may travel through the substrate 102 in package 150 and to the die 124b via wire bonds 131.

Voltages other than read/write signals, such as power/ground, clock signals and chip enable signals, may also travel to/from a semiconductor die in the top semiconductor package 150 via the package 100. For example, a voltage may be communicated between the host device and a semiconductor die 124 in package 150 by travelling through the package 100 via the substrate 102, wire bonds 133 and interposer layer 134 to the solder balls 140. From there, the signal may travel through the substrate 102 in package 150 and to a semiconductor die 124 via wire bonds 130 or 131.

Figure 14:
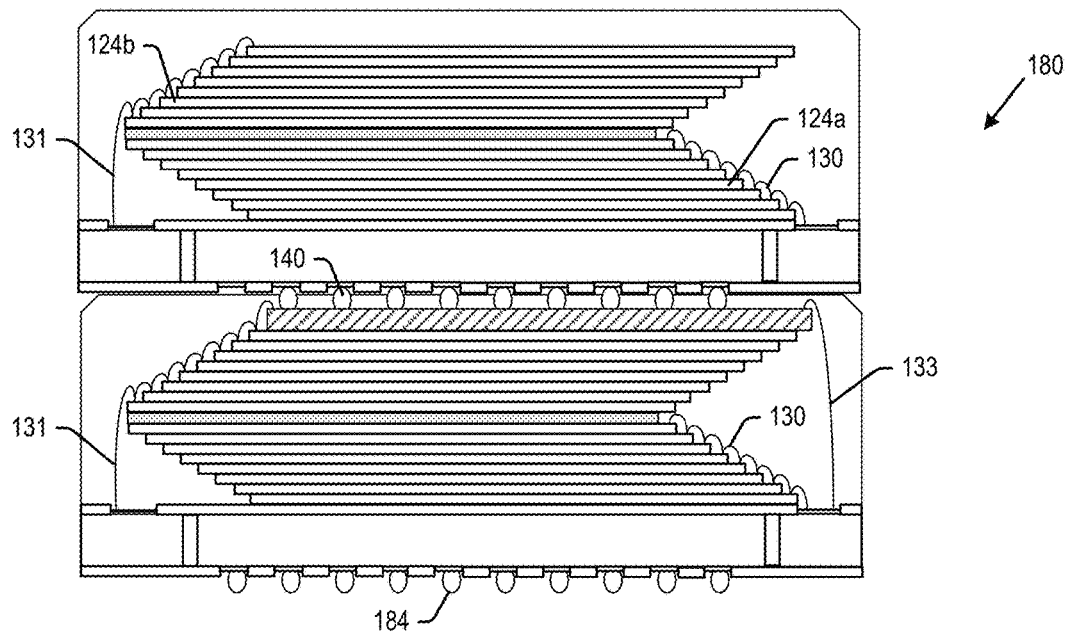
FIG. 14 shows first and second semiconductor packages affixed to each other to form a completed semiconductor device according to an embodiment of the present technology.
Figure 15:
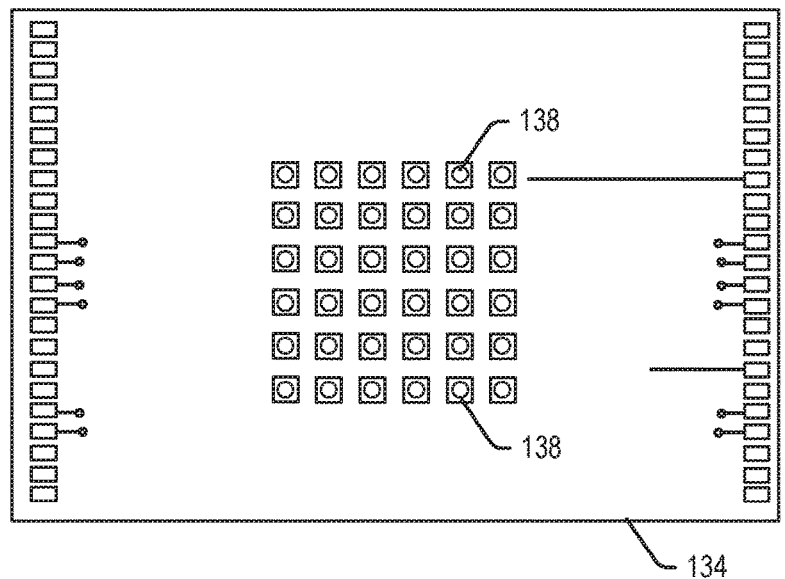
FIGS. 15 and 16 show an interposer layer and a completed semiconductor device, respectively, according to a further embodiment of the present technology.
Figure 16:
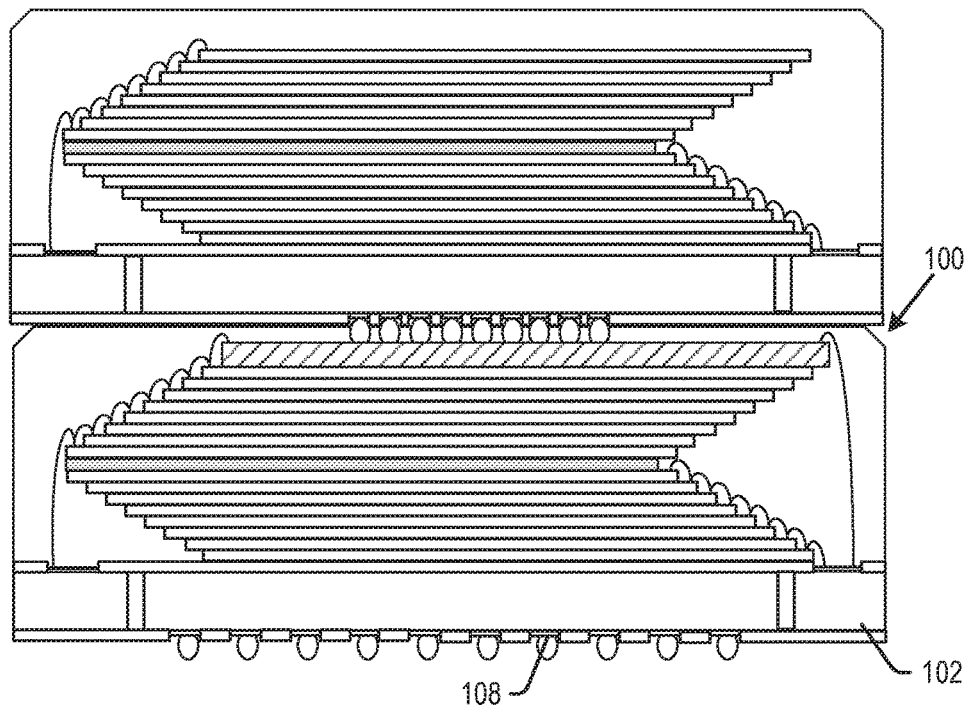

As noted above, the pattern of solder balls 140 extending through a surface of the mold compound in lower package 100 may match a pattern of contact pads 108 on a bottom surface of the upper package 150. In embodiments, this pattern of contact pads 108 on the bottom surface of package 150 may also be the same as the pattern of contact pads 108 on the bottom surface of package 100 (as shown in FIGS. 13 and 14) so that the packages 100 and 150 may be fabricated using the same materials and processes. However, in further embodiments, the pattern of contact pads 108 on the bottom surface of package 150 may be different from the pattern of contact pads 108 on the bottom surface of package 100. Such an embodiment is shown in FIGS. 15 and 16. In this embodiment, the pattern of solder balls 140 at the top surface of the package 100 and the pattern of contact pads 108 in the bottom surface of the package 150 are provided to match each other.

Figure 17:
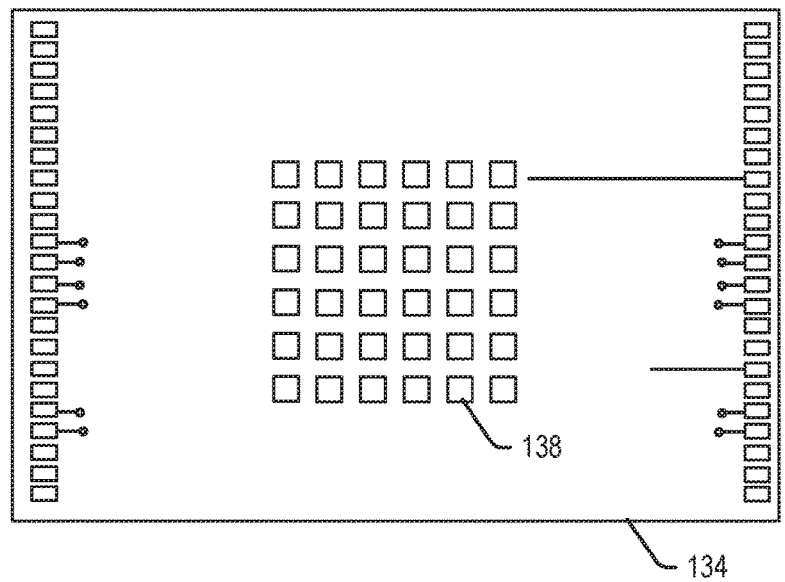
FIGS. 17 and 18 show an interposer layer and a completed semiconductor device, respectively, according to another embodiment of the present technology.
Figure 18:
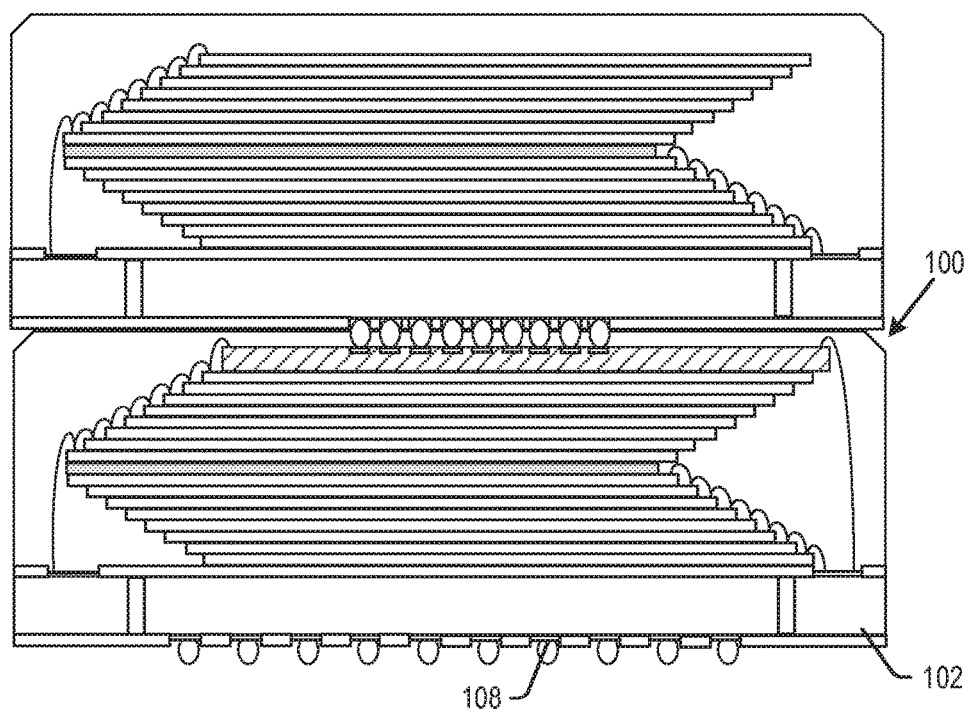

In embodiments described above, the interposer layer 134 includes solder balls 140 on the contact pads 138 which extend out of the package 100 to bond with contact pads 108 on a lower surface of the package 150. In further embodiments, the solder balls may instead initially be mounted on the contact pads 108 of the package 150. Such an embodiment is shown in FIGS. 17 and 18. In this embodiment, the interposer layer 134 of package 100 is formed as described above, but without solder balls 140 (FIG. 17). The package 100 is then encapsulated, but with openings in the mold compound at an upper surface to leave the contact pads 138 of the interposer layer 134 exposed.

In such an embodiment, the upper package 150 is formed with contact pads 108 in the lower surface of the substrate 102, and solder balls 140 are applied to these contact pads 108. The pattern of contact pads 108 and solder balls 140 in package 150 matches the contact pads 138 in the interposer layer 134 of package 100. The packages 100 and 150 may be affixed to each other by aligning the package 150 over the package 100, and mating the solder balls 140 of package 150 with the exposed contact pads 138 in package 100. The solder balls may then be reflowed as explained above to physically and electrically couple the packages 100 and 150 together to form the semiconductor device 180.

As noted above, the semiconductor package 100 may be formed on a panel of substrates, and the semiconductor package 150 may similarly be formed on a panel of substrates. After formation of the packages 100 and 150 (and prior to being affixed to each other), the packages 100 and 150 may be singulated from their respective substrate panels after they are encapsulated. Each semiconductor package 100, 150 may be singulated by any of a variety of cutting methods including sawing, water jet cutting, laser cutting, water guided laser cutting, dry media cutting, and diamond coating wire cutting. While straight line cuts will define generally rectangular or square shaped semiconductor packages 100, 150, it is understood that semiconductor package 100 and/or 150 may have shapes other than rectangular and square in further embodiments of the present invention.

In further embodiments, the singulated packages 150 may be affixed to the packages 100 while the packages 100 remain as part of the substrate panel. Thereafter, the completed semiconductor devices 180 may be singulated. In still further embodiments, a panel of packages 150 may be aligned over and mounted to a panel of packages 100. Thereafter, the panels of affixed packages 100 and 150 may be singulated together.

During and after completion of the respective packages 100 and 150 (but before being affixed to each other), each of the packages 100 and 150 may be tested for operation and quality. It is a feature of the present technology to provide a higher yield of semiconductor devices. In particular, a single semiconductor package including for example 32 semiconductor die has a higher probability of being defective than a single semiconductor package including 16 die. In accordance with an example of the present technology, two 16 die packages may be tested and, if found to be working properly, affixed to each other. Thus, the semiconductor device 180 of the present technology provides the same memory capacity as a single package having a like number of die, but may be fabricated with a higher yield.

Additionally, defects in fabricated semiconductor packages are often not fatal, but result in finished semiconductor packages of varying quality. Finished semiconductor packages may be tested in a "binning" process, and categorized based on their performance. It is a further feature of the present technology that binning allows semiconductor packages of like quality to be affixed to each other. This allows for higher overall quality of the produced semiconductor devices 180 as compared to devices including a single package having the same number of semiconductor die.

A further feature of the present technology as compared to a single package including a like number of semiconductor die is that the interposer layer 134 in effect acts as a redistribution layer (RDL) enabling greater flexibility and better management of signal/power/ground communication between the semiconductor die in the semiconductor device 180 and the host device.

The finished semiconductor device 180 may for example be a memory card such as for example an MMC card, an SD card, a multiuse card, a micro-SD card, a memory stick, a compact SD card, an ID card, a PCMCIA card, an SSD card, a chip-card, a smartcard, an USB card, an MCP-type embedded card storage, or the like.

In summary, in one example, the present technology relates to a semiconductor device, comprising: a first semiconductor package, comprising: a first substrate, a first plurality of semiconductor die, an interposer layer having a plurality of solder balls affixed to a surface of the interposer layer, and a first mold compound encapsulating at least a portion of the first semiconductor package, at least a portion of the solder balls extending through a surface of the first mold compound; and a second semiconductor package, comprising: a second substrate comprising contact pads on a surface of the second substrate, a second plurality of semiconductor die, and a second mold compound encapsulating at least a portion of the second semiconductor package; a pattern of the solder balls extending through the surface of the first mold compound matching a pattern of the contact pads on the surface of the second substrate, the solder balls being affixed to the contact pads to couple the first semiconductor package to the second semiconductor package.

In another example, the present technology relates to a semiconductor device, comprising: a first semiconductor package, comprising: a first substrate, a first plurality of semiconductor die, an interposer layer having a plurality of contact pads in a surface of the interposer layer, and a first mold compound encapsulating at least a portion of the first semiconductor package, the contact pads being exposed through a surface of the first mold compound; and a second semiconductor package, comprising: a second substrate comprising: contact pads on a surface of the second substrate, and solder balls affixed to the contact pads, a second plurality of semiconductor die, and a second mold compound encapsulating at least a portion of the second semiconductor package; a pattern of the solder balls on the contact pads of the second substrate matching a pattern of the contact pads on the surface of the interposer layer, the solder balls being affixed to the contact pads to couple the first semiconductor package to the second semiconductor package.

In a further example, the present technology relates to a semiconductor device, comprising: a first semiconductor package, comprising: a first substrate comprising a first set of contact pads on a surface of the first substrate, a first plurality of semiconductor die, an interposer layer having a plurality of contacts, a first set of wire bonds extending between the interposer layer, the first plurality of semiconductor die and the first substrate, a second set of wire bonds extending between the interposer layer and the first substrate, bypassing the first plurality of semiconductor die, and a first mold compound encapsulating at least a portion of the first semiconductor package; a second semiconductor package, comprising: a second substrate comprising a second set of contact pads on a surface of the second substrate, a second plurality of semiconductor die, a third set of wire bonds extending between the second plurality of semiconductor die and the second substrate, and a second mold compound encapsulating at least a portion of the second semiconductor package; solder connecting the plurality of contacts on the interposer layer with the second set of contact pads on the surface of the second substrate to electrically couple the first and second semiconductor packages.

In another example, the present technology relates to a semiconductor device, comprising: a first semiconductor package, comprising: a first substrate comprising a first set of contact pads on a surface of the first substrate, a first plurality of semiconductor die, an interposer means for transferring voltages between the first semiconductor package and a second semiconductor package, a first electrical connection means for transferring voltages between the interposer means, the first plurality of semiconductor die and the first substrate, a second electrical connection means for transferring voltages between the interposer layer and the first substrate, bypassing the first plurality of semiconductor die, and a first mold compound encapsulating at least a portion of the first semiconductor package; the second semiconductor package, comprising: a second substrate comprising a second set of contact pads on a surface of the second substrate, a second plurality of semiconductor die, a third electrical connection means for transferring voltages between the second plurality of semiconductor die and the second substrate, and a second mold compound encapsulating at least a portion of the second semiconductor package; and connecting means for connecting the plurality of contacts on the interposer layer with the second set of contact pads on the surface of the second substrate to electrically couple the first and second semiconductor packages.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
   a first semiconductor package, comprising:
   a first substrate,
   a first plurality of semiconductor die,
   an interposer layer having a plurality of solder balls affixed to a surface of the interposer layer,
   a first set of wire bonds extending from the substrate, to each of the first plurality of semiconductor die, and from one of the semiconductor die in the first plurality of semiconductor die to the interposer layer,
   a second set of wire bonds extending directly between the interposer layer and the substrate, and
   a first mold compound encapsulating at least a portion of the first semiconductor package, at least a portion of the solder balls extending through a surface of the first mold compound; and
   a second semiconductor package, comprising:
   a second substrate comprising contact pads on a surface of the second substrate,
   a second plurality of semiconductor die, and
   a second mold compound encapsulating at least a portion of the second semiconductor package;
   a pattern of the solder balls extending through the surface of the first mold compound matching a pattern of the contact pads on the surface of the second substrate, the solder balls being affixed to the contact pads to couple the first semiconductor package to the second semiconductor package.

2. The semiconductor device of claim 1, wherein signals communicated between the second semiconductor package and a host device occur through the first semiconductor package.

3. The semiconductor device of claim 2, wherein the reading of data from and/or the writing of data to the second plurality of semiconductor die in the second package is performed using in part a first set of wire bonds connected to the first plurality of semiconductor die in the first package.

4. The semiconductor device of claim 3, wherein the transmission of voltages other than for reading data from or writing data to the second plurality of semiconductor die in the second package is performed using in part a second set of wire bonds in the first package that are not connected to the first plurality of semiconductor die in the first package.

5. The semiconductor device of claim 4, wherein the second set of wire bonds extend between the interposer layer and the first substrate.

6. The semiconductor device of claim 1, wherein the first plurality of semiconductor die are in the same binning classification as the second plurality of semiconductor die.

7. The semiconductor device of claim 1, wherein the first semiconductor package has the same configuration as the second semiconductor package.

8. The semiconductor device of claim 1, wherein the first semiconductor package has a different configuration than the second semiconductor package.

9. The semiconductor device of claim 1, wherein the contact pads on a surface of the second substrate are a first set of contact pads, the device further comprising a second set of contact pads on a surface of the first substrate, a pattern of the first set of contact pad matching a pattern of the second set of contact pads.

10. The semiconductor device of claim 1, wherein the contact pads on a surface of the second substrate are a first set of contact pads, the device further comprising a second set of contact pads on a surface of the first substrate, a pattern of the first set of contact pad being different from a pattern of the second set of contact pads.

* * * * *